US010735020B2

(12) United States Patent
Gowdhaman et al.

(10) Patent No.: US 10,735,020 B2
(45) Date of Patent: Aug. 4, 2020

(54) VOLTAGE DETECTOR (71) Applicant: TEXAS INSTRUMENTS INCORPORATED, Dallas, TX (US)

(72) Inventors: Santhosh Kumar Gowdhaman, Bangalore (IN); Divya Kaur, Delhi (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/399,056

(22) Filed: Apr. 30, 2019

(65) Prior Publication Data
US 2020/0076447 A1  Mar. 5, 2020

(30) Foreign Application Priority Data

Aug. 30, 2018  (IN) .............................. 201841032531

(51) Int. Cl.
*H03M 1/78* (2006.01)
*G01R 19/165* (2006.01)
*H01L 27/08* (2006.01)

(52) U.S. Cl.
CPC ...... *H03M 1/785* (2013.01); *G01R 19/16538* (2013.01); *H01L 27/0802* (2013.01)

(58) Field of Classification Search
CPC ...... H03M 1/785; H03M 1/0646; H03M 1/12; G01R 19/16538; H01L 27/0802
USPC .................................................. 341/144, 154
See application file for complete search history.

(56) References Cited

U.S. PATENT DOCUMENTS

| 3,755,807 | A | 8/1973 | Brown |
| 4,703,302 | A | 10/1987 | Hino et al. |
| 5,416,482 | A | 5/1995 | Ueki |
| 7,132,849 | B2 * | 11/2006 | Tucker ............... H03K 19/1731 326/38 |
| 8,084,997 | B2 | 12/2011 | Miyamoto |
| 8,732,511 | B2 | 5/2014 | Sawarkar |
| 8,830,103 | B2 * | 9/2014 | Suzuki ................. H03M 1/785 341/144 |
| 9,397,688 | B2 * | 7/2016 | Shill ....................... H03M 1/68 |
| 9,634,686 | B2 * | 4/2017 | Shill ....................... H03M 1/68 |
| 10,014,873 | B1 * | 7/2018 | van Veldhoven ..... H03M 1/066 |
| 10,102,998 | B2 | 10/2018 | Simon et al. |
| 2009/0146856 | A1 * | 6/2009 | Chen ..................... H03M 1/687 341/154 |
| 2018/0357433 | A1 | 12/2018 | Kalafala et al. |

* cited by examiner

*Primary Examiner* — Jean B Jeanglaude
(74) *Attorney, Agent, or Firm* — Mark Allen Valetti; Charles A. Brill; Frank D. Cimino (57) ABSTRACT A voltage detector circuit including a ladder selector that includes a first node, a second node and a selector node. The voltage detector circuit also includes a first resistive ladder that includes a first string of resistors coupled between a sensing input node and the first node of the ladder selector and a first set of transistors. An input node of each transistor in the first set of transistors is coupled to a respective intermediate node between two resistors in a subset of resistors in the first string of resistors and an output node of each transistor in the first set of transistors is coupled to a sensing output node. The voltage detector circuit also includes a second resistive ladder that includes a second string of resistors coupled between the sensing input node and the second node of the ladder selector and a second set of transistors.

23 Claims, 4 Drawing Sheets

VOLTAGE DETECTOR

CROSS-REFERENCE TO RELATED APPLICATION

This application claims the benefit of priority to India Provisional Application No. 201841032531, filed on 30 Aug. 2018, the entirety of which is herein incorporated by reference.

TECHNICAL FIELD

This relates generally to electronic circuitry, and more particularly to voltage detectors.

BACKGROUND

A voltage detector is a device that determines the presence/absence of an electrical charge in an object. In some examples, a voltage detector is implemented as a simple piece of testing hardware that indicates the presence of electricity. In other examples, a voltage detector is implemented as an advanced tool that detects precise voltage levels in electrical systems.

Electronic devices frequently employ a voltage detector to indicate if a particular voltage is outside a specified range. For example, a battery operated device often includes a voltage detector to provide a low voltage indication when the voltage supplied by a battery decreases below a predetermined level. In some examples, the low voltage indication notifies a user of the device that the battery should be replaced or recharged.

SUMMARY

In a first example, a voltage detector circuit includes a ladder selector having a first node, a second node and a selector node. The voltage detector circuit also includes a first resistive ladder that includes a first string of resistors coupled between a sensing input node and the first node of the ladder selector and a first set of transistors. An input node of each transistor in the first set of transistors is coupled to a respective intermediate node between two resistors in a subset of resistors in the first string of resistors and an output node of each transistor in the first set of transistors is coupled to a sensing output node. The voltage detector circuit further includes a second resistive ladder that includes a second string of resistors coupled between the sensing input node and the second node of the ladder selector and a second set of transistors. An input node of each transistor in the second set of transistors is coupled to an intermediate node coupled between two resistors in a subset of resistors in the second string of resistors and an output node of each transistor in the second set of transistors is coupled to the sensing output node.

In a second example, a voltage detector includes a ladder selector configured to select between a first resistive ladder and a second resistive ladder. The first resistive ladder includes a first string of resistors coupled between a sensing input node and a first node of the ladder selector. The first resistive ladder also includes a first set of transistors configured to tap intermediate nodes of a set of resistors in the first string of resistors. The second resistive ladder includes a second string of resistors coupled between the sensing input node and a second node of the ladder selector. The second set of transistors also includes a second set of transistors configured to tap intermediate nodes of a set of resistors in the second string of resistors. A selected transistor in one of the first set of transistors or the second set of transistors is turned on, and non-selected transistors of the first set of transistors and the second set of transistors are turned off to set a threshold voltage for a sensing output node.

In a third example, a system includes a controller configured to select a threshold voltage that is within a range of a low threshold voltage and a high threshold voltage. The system includes a voltage detector that includes a ladder selector configured to select between a first resistive ladder and a second resistive ladder. The first resistive ladder including a first string of resistors coupled between a sensing input node and a first node of a ladder selector. The first resistive ladder also includes a first set of transistors configured to tap intermediate nodes of a set of resistors in the first string of resistors. The second resistive ladder includes a second string of resistors coupled between the sensing input node and a second node of the ladder selector. The second resistive ladder also includes a second set of transistors configured to tap intermediate nodes of a set of resistors in the first string of resistors. The controller turns on a selected transistor of the first set of transistors or the second set of transistors and the controller turns off non-selected transistors of the first set of transistors and the second set of transistors to set a threshold voltage for a sensing output node. The system further includes a comparator circuit configured to assert a reset signal based on a comparison of the voltage at the sensing output node and a reference voltage.

DETAILED DESCRIPTION

This disclosure relates to systems and circuits that include voltage detector configured to sense a voltage from a voltage source. In some examples, the voltage detector is implemented as a multiple resistive ladder voltage detector, such as a voltage detector with two or more resistive ladders. In an example, the voltage detector includes a first resistive ladder and a second resistive ladder. The first resistive ladder and the second resistive ladder are coupled between a sensing input node and a sensing output node. The first resistive ladder is coupled to a first node of a ladder selector and the second resistive ladder is coupled to a second node of the ladder selector.

Problems exist with voltage detectors that include a single resistive ladder having a string of resistors with a set of transistors configured to tap intermediate nodes of the string of resistors. In particular, at certain voltage threshold levels (e.g., a low threshold voltage level) due to the low potential of an input node (e.g., a source) of a final transistor in the set of transistors, the final transistor has a leakage current that increases an error of the voltage detector with a single resistive ladder. This increased error may cause problems in circuits where high accuracy is needed. Moreover, the leakage current of the final transistor increases as a function of temperature.

To overcome the problems with a single resistive ladder, this disclosure provides the aforementioned multiple resistor ladder voltage detector configured to curtail leakage current in the manner described herein. In the multiple resistive ladder voltage detector, the first resistive ladder and the second resistive ladder are each configured to include a respective string of resistors and a set of transistors positioned within each respective string of resistors. For purposes of simplification of explanation, it is presumed that each string of resistors has the same number of resistors of equal resistance. The first resistive ladder and the second resistive ladder, each have two sets of resistors, and both the first and second resistive ladders have N+K number of resistors, where N and K are integers greater than or equal to one. The first set of resistors in the first resistive ladder has N number of resistors. The second set of resistors in the first resistive ladder has K number of resistors. More particularly, in some examples, a first through Nth number of resistors (the first set of resistors) in the string of resistors in the first resistive ladder have intermediate transistors operating as trim switches. Moreover, in the first resistive ladder, resistors N+1 through N+K (the second set of resistors) are connected in series, and do not have intermediate transistors connected there between.

As noted, the second resistive ladder also includes N+K number of resistors. In some examples, the second resistive ladder includes a first set of resistors, namely resistors 1 through N+1 connected in series (connected in series without any intermediate transistors). Additionally, in some examples, the second resistive ladder includes resistors N+1 through N+K that each have intermediate transistors configured to operate as trim switches, such that there are K−1 number of resistors in the second set of resistors in the second resistive ladder. Thus, between the first resistive ladder and the second resistive ladder, there are N+K−1 total number of transistors configured as trim switches.

The transistors in the first resistive ladder and the second resistive ladder are configured tap a voltage at an intermediate node between resistors of the respective first resistive ladder and the second resistive ladder. For example, the controller is configured to turn on a selected one of the transistors in the first resistive ladder or the second transitive ladder and the controller is configured to turn off the other transistors in the first resistive ladder and the second transitive ladder to set a threshold voltage for the sensing output node. The particular transistor that is selected to be turned on is based on a desired threshold voltage. For example, the selected transistor that is turned on is configured to tap a respective node of the first or second ladder to set the voltage at the sensing output node to a fractional portion of the voltage at the sensing input node. As a result, current flows from the voltage sensing input node, through resistors upstream and downstream of the selected transistor, through the ladder selector and to an electrically neutral node (e.g., ground). Moreover, the voltage tapped at an input node of the selected transistor is provided as a voltage sensing output at the voltage sensing output node.

In some examples, a comparator is configured to compare the sensing output voltage to a reference voltage to determine if the voltage at the voltage sensing input node exceeds a threshold voltage that is set based on the selected transistor. By employment of the multi-ladder voltage detector described herein, a large range of threshold voltages are possible for the same voltage detector compared to existing voltage detectors that lose accuracy for voltages greater than 10 V. More particularly, in some examples, a low threshold voltage for the voltage detector is about 0.5 volts (V) and a high threshold voltage for the voltage detector is about 100 V. Moreover, by employing multiple ladders, leakage current at a last transistor (in the second resistive ladder) is curtailed by increasing a voltage at an input node voltage of the last transistor, thereby improving accuracy of the sensed voltage, particularly in high temperature environments. More particularly, when the last transistor is turned off, the input node (e.g., a source) the last transistor may be raised to a voltage level above an electrically neutral to increase a negative magnitude of a potential difference between a control node (e.g., a gate) and the input node of the last transistor, thereby curtailing the leakage current.

Figure 1:
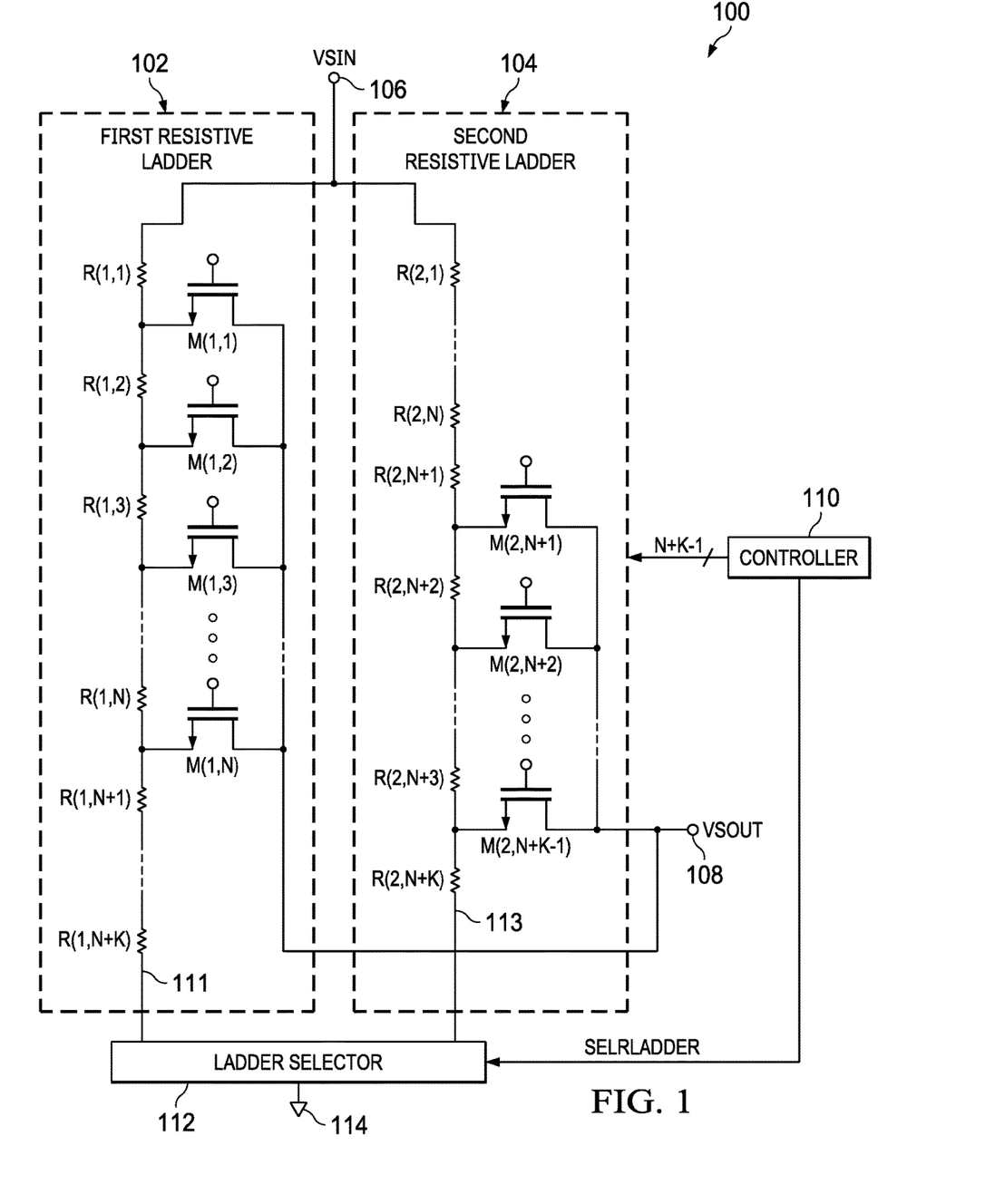
FIG. 1 illustrates a circuit diagram of a voltage detector with two resistive ladders.

FIG. 1 is a circuit diagram of an example voltage detector 100. The voltage detector 100 is a two resistive ladder voltage detector that includes a first resistive ladder 102 and a second resistive ladder 104. As an alternative, the first resistive ladder 102 and/or the second resistive ladder 104 may be referred to simply as ladders. The first resistive ladder 102 and the second resistive ladder 104 are each coupled between a sensing input node 106 and a sensing output node 108. The voltage detector 100 is configured such that a sensing output voltage, VSOUT at the sensing output node 108, is proportional to a sensing input voltage, VSIN as the sensing input node 106. Moreover, the voltage detector 100 is configured such that the voltage at the sensing output node 108, namely the sensing output voltage, VSOUT is a selectable fractional portion of the sensing input node 106, VSIN. Advantageously, as explained herein, the inclusion of two resistive ladders, namely the first resistive ladder 102 and the second resistive ladder 104 curtails leakage current of a last transistor (labeled as M(2,N+K−1) in the voltage detector 100 by electrically isolating an input node of the last transistor from an electrically neutral node (e.g., ground).

The first resistive ladder 102 and the second resistive ladder 104 are implemented as voltage dividers with a respective string of connected resistors. In some examples, the first resistive ladder 102 includes N+K number of resistors, wherein N and K are integers greater than one. Similarly, the second resistive ladder 104 also includes N+K number of resistors. The resistors in the first resistive ladder 102 and the second resistive ladder 104 are labeled with a unique two-dimensional index number, represented with the nomenclature, R(i,j). The first dimension in the index number, i identifies a ladder to which the respective resistor belongs, and the second index number, j identifies a sequence number of the resistor. For example, a resistor labeled R(1,3) uniquely identifies the respective resistor as a third resistor in the first resistive ladder 102. Similarly, a resistor labeled R(2,N) uniquely identifies the resistor as an Nth resistor in the second resistive ladder 104. Thus, the resistors in the first resistive ladder 102 are labeled R(1,1) . . . R(1,N+K) and resistors in the second resistive ladder 104 are labeled R(2,1) . . . R(2,N+K). Moreover, in some examples, resistors with the same sequence number have the same or nearly the same resistance (e.g., within about 10 ohms (Ω)). Thus, in such examples, resistors R(1,1) and R(2,1) have the same or nearly the same resistance.

For ease of explanation, the same index nomenclature is used to identify transistors in each respective resistive ladder 102, 104. The first resistive ladder 102 also includes N number of transistors labeled with the same index number as a respective resistor. More particularly, the first resistive ladder 102 includes transistors M(1,1) . . . M(1,N). Similarly, the second resistive ladder 104 has K−1 number of transistors labeled with the same index number as a respective resistor. More particularly, the second resistive ladder includes transistors M(2,N+1) . . . M(2,K−1). Thus, the first resistive ladder 102 and the second resistive ladder 104 have a combined total of N+K−1 number of transistors. However, the second resistive ladder 104 may have a different number of transistors than the first resistive ladder 102.

In some examples, the N+K−1 number of transistors are configured as switches (e.g., trim switches). In some examples, the N+K−1 number of transistors are implemented as metal-oxide semiconductor field effect transistors (MOSFETs). More particularly, the N+K−1 number of transistors are implemented as n-channel enhancement mode MOSFETS (NMOSs). For purposes of simplification of explanation, the transistors of the first resistive ladder 102 and the second resistive ladder 104 are illustrated as being implemented as NMOSs. However, in other examples, other types of transistors, such as P-channel enhancement mode MOSFETS (PMOSs) are employable as the transistors in the first resistive ladder 102 and/or the second resistive ladder 104. In yet other examples, a different type of transistor may be used, such as Group III-V transistor (e.g., as gallium nitride (GaN) transistor), isolated gate bipolar transistor (IGBT), bipolar junction transistor (BJT), and silicon carbide (SiC) transistor.

An output node (e.g., a drain) of each transistor in the N+K−1 number of transistors is coupled to the sensing output node 108. Moreover, in some examples, a control node (e.g., a gate) of the N+K−1 number of transistors is controlled by a controller 110, such as a trim controller or other digital controller. In other examples, the control node of the N−K number of transistors are hard-wired to particular nodes with particular voltage levels. The controller 110 is illustrated as having N+K−1 outputs that are each routed to a control node of a respective transistor. For purposes of readability, FIG. 1 omits individual paths from the controller 110 to the control node of each of the N+K−1 number of transistors.

A first node of the first resistor of the first resistive ladder 102, namely resistor R(1,1) is coupled to the sensing input node 106. A second node of the resistor R(1,1) is coupled to an input node (e.g., a source) of the respective transistor, namely, transistor M(1,1), forming a first rung of the first resistive ladder 102. Additionally, the second node of the resistor R(1,1) is coupled to a first node of the second resistor of the first resistive ladder 102, namely, resistor R(1,2). Accordingly, an intermediate node between the resistors R(1,1) and R(1,2) is coupled to the input node of the transistor M(1,1). In a similar manner, a second node of the resistor R(1,2) is coupled to an input node (e.g., a source) of the respective transistor, namely transistor M(1,2) forming a second rung of the first resistive ladder 102. Accordingly, an intermediate node between the resistor R(1,2) and R(1,3) is coupled to the input node of the transistor M(1,2). In a similar manner, the third through Nth resistors (resistors R(1,3) . . . R(1,N) and respective third through Nth transistors (transistors M(1,3) . . . M(1,N)) are configured in a similar manner to form the third through Nth rungs of the first resistive ladder 102. Moreover, the resistors N+1 to K of the first resistive ladder are coupled in series and do not include intermediate transistors. Additionally, a second node of the last resistor of the first resistive ladder 102, namely resistor R(1,N+K) is coupled to a first node 111 of a ladder selector 112.

A first node of the first resistor of the second resistive ladder 104, namely resistor R(2,1) is coupled to the sensing input node 106. Additionally, in the second resistive ladder, resistors R(2,1) to R(2,N+1) are connected in series. Accordingly, a first node of the resistor R(2,N+1) is coupled to a second node of a previous resistor, namely, resistor R(2,N). A second node of the resistor R(2,N+1) is coupled to an input node (e.g., a source) of the respective transistor, namely, transistor M(2, N+1), forming a first rung of the second resistive ladder 104. Additionally, the second node of the resistor R(2,N+1) is coupled to a first node of the next resistor of the second resistive ladder 104, namely, resistor R(2,N+2). Accordingly, an intermediate node between the resistors R(2,N+1) and R(2,N+2) is coupled to the input node of the transistor M(2,N+1). In a similar manner, a second node of the resistor R(2,N+2) is coupled to an input node (e.g., a source) of the respective transistor, namely transistor M(2,N+2) forming a second rung of the second resistive ladder 104. Accordingly, an intermediate node between the resistors R(2,N+2) and R(2,N+3) is coupled to the input node of the transistor M(2,N+2). In a similar manner, resistors R(2,N+3) to R(2,N+K) and respective third through Mth transistors (transistors M(2,N+3) to M(2, N+K−1)) are configured in a similar manner to form the third through Kth rungs of the second resistive ladder 104. Additionally, a second node of the last resistor of the second resistive ladder 104, namely resistor R(2,N+K) is coupled to a second node 113 the ladder selector 112.

As explained, the first resistive ladder 102 and the second resistive ladder 104 both have a string of resistors connected in series (without a respective intermediate transistor). As noted, resistors R(1,N+1) to R(1,N+K) of the first resistive ladder 102 are connected in series and resistors R(2,1) to R(2,N+1) of the second resistive ladder 104 are connected in series. For purposes of simplification of explanation, these series of resistors R(1,N+1) to R(1,N+K) and R(2,1) to R(2,N+1) are illustrated as being discrete circuit components. However, in some examples, the series of resistors R(1,N+1) to R(1,N+K) and/or R(2,1) to R(2,N+1) are replaceable with a single resistor (or multiple resistors) that has an equivalent resistance. Accordingly, a series resistance of a subset resistors R(1,1) . . . R(1,N) of the first resistive ladder 102 is approximately equal to a resistance between the sensing input node 106 and first node of resistor R(2, N+1) of the second resistive ladder 104, which is a node in the second resistive ladder 104 that is both (i) connected to a next resistor (namely, resistor R(2,N+2)) and (ii) is not connected to an input node of a transistor. Similarly, a series resistance of a subset of resistors R(2,N+1) . . . R(2,N+K) of the second resistive ladder 104 is approximately equal to a resistance between an input node a last transistor in the first resistive ladder 102, namely transistor M(1,N) and the first node 111 of the ladder selector 112.

The ladder selector 112 is configured to receive a ladder selector signal, SELRLADDER. In some examples, the ladder selector signal, SELRLADDER is provided from the controller 110. In other examples, the ladder selector signal, SELRLADDER is hard-wired. The ladder selector 112 is configured such that if the ladder selector signal, SELRLADDER indicates that the first resistive ladder 102 is to be selected, the ladder selector 112 closes a switch (e.g., formed with a transistor) to couple the second node of resistor R(1,N+K) (the last resistor in the first resistive ladder 102) to an electrically neutral node 114 (e.g., ground) or at least a voltage level lower than the sensing input node 106. Moreover, if the ladder selector signal, SELRLADDER indicates that the first resistive ladder 102 is to be selected, the ladder selector 112 opens a switch (e.g., formed with a transistor) to provide an open circuit between the second node of resistor R(2,N+K) (the last resistor in the second resistive ladder 104) and the electrically neutral node 114 (e.g., ground). Conversely, if the ladder selector signal, SELRLADDER indicates that the second resistive ladder 104 is to be selected, the second node of the resistor R(2,N+K) is coupled to the electrically neutral node 114 through the ladder selector 112, and the second node of the resistor R(1,N+K) is disconnected from the electrically neutral node 114.

Figure 2:
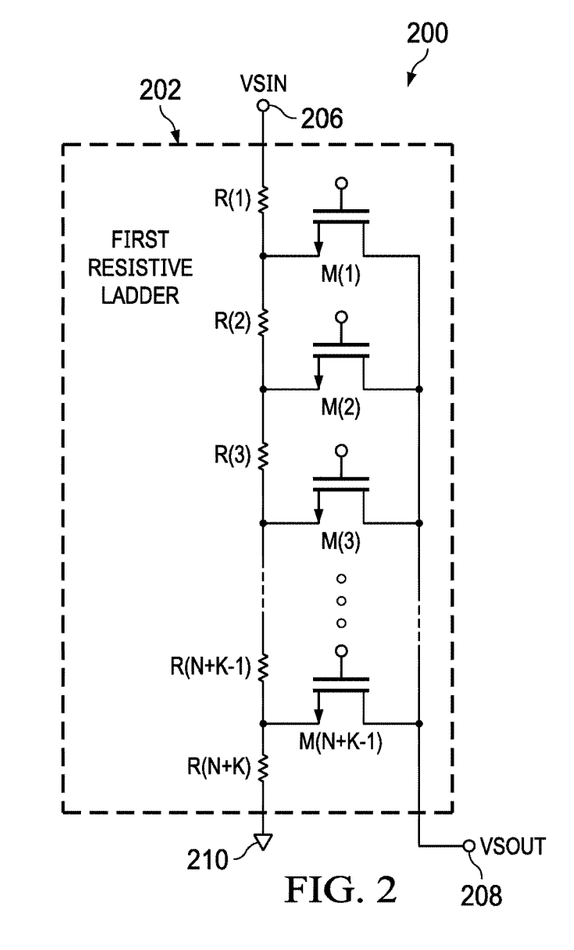
FIG. 2 illustrates a circuit diagram of a voltage detector with a single resistive ladder.

FIG. 2 is a circuit diagram of a voltage detector 200 that includes a single resistive ladder 202 with accuracy problems caused by a relatively large leakage current in a last NMOS transistor (e.g., M(N+K−1)). This relatively large leakage current increases an error of the voltage detector 200, thereby reducing an accuracy of the voltage detector 200. The single resistive ladder 202 is coupled between a sensing input node 206 and a sensing output node 208. For example, the voltage detector 200 is configured such that a voltage at a sensing output VSOUT at the sensing output node 208 is proportional to a voltage as a sensing input voltage, VSIN at the sensing input node 206. Moreover, the voltage detector 200 is configured such that the voltage at the sensing output node 208, VSOUT is a selectable fractional portion of the sensing input voltage VSIN at the sensing input node 206, wherein the selectable fractional portion corresponds to a selectable detector threshold, VTH. Moreover, the voltage detector 200 is designed such that the detector threshold voltage, VTH is selectable between a high threshold voltage, VTH_HIGH to a low threshold voltage, VTH_LOW, which depends on the number and locations of taps in each of the ladders as well as the resistance between the taps.

The single resistive ladder 202 includes a string of N+K number of resistors, labeled R(1) to R(N+K). Moreover, the single resistive ladder 202 includes N+K−1 number of NMOSs labeled M(1) to M(N+K−1) that are connected downstream of a respective resistor and upstream of a next resistor. Thus, NMOS M(1) is coupled downstream of resistor R(1) and upstream of resistor R(2). Further, a node of the last resistor, namely resistor R(N+K) is coupled to an electrically neutral node 210 (e.g., ground).

In situations where the low threshold voltage, VTH_LOW is selected, the first NMOS, namely NMOS M(1) is selected such that a logical 1 is applied to a gate of the NMOS M(1), and NMOS M(1) is turned on (e.g., operates in saturation mode). Moreover, a logical 0 (e.g., ground) is applied to the gate of the remaining NMOSs M(2) to M(N+K−1), such that the remaining NMOSs M(2) to M(N+K−1) are turned off (e.g., operate in the cutoff mode). The resistors R(1) . . . R(N+K) operate as a voltage divider, and in situations where the low threshold voltage, VTH_LOW is selected, the voltage at the second node of R(1), the voltage at the source of the NMOS M(1) is a greatest fractional portion of the sensing input voltage, VSIN. In this situation, the gate to source voltage of the transistor M(N+K−1), $V_{GS}$ is defined by Equation 1.

$$V_{GS} \approx -VSIN * \left(\frac{VTH\_LOW}{VTH\_HIGH}\right) \quad \text{Equation 1}$$

Wherein:
$V_{GS}$ is the gate to source voltage of the NMOS N+K−1;
VSIN is the input sensing voltage at the sensing input node 206;

VTH_LOW is the low detector threshold voltage of the voltage detector 200 with the single resistive ladder 202; and
VTH_HIGH is the high detector threshold voltage of the voltage detector 200 with the single resistive ladder 202.

Moreover, the leakage current of the NMOS N+K−1, $I_{OFF}$ is defined by Equation 2. Alternatively, the leakage current, $I_{OFF}$ of the NMOS N+K−1 may be referred to as a sub-threshold current or off current.

$$I_{OFF} \propto e^{-\left(\frac{VTH\_LOW}{VTH\_HIGH}\right)*VTH\_LOW-VTH0}{VT}} \quad \text{Equation 2}$$

Wherein:
$I_{OFF}$ is the leakage current of NMOS M(N+K−1) for the voltage detector 200 with the single resistive ladder 202;
e is Euler's number, approximately 2.71828;
VTH_LOW is the low threshold voltage for the voltage detector 200 with the single resistive ladder 202;
VTH0 is the intrinsic threshold voltage of the NMOS M(N+K−1); and
VT is the temperature voltage derived from Equation 3.

$$VT = \frac{k*T}{q} \quad \text{Equation 3}$$

Wherein:
k is Boltzmann constant, equal to, 8.6173303(50)×10-5 eV*K$^{-1}$
T is the environmental temperature, in Kelvin (K)
q is the electron charge in coulombs (C), approximately 1.6021766208(98)×10$^{-19}$ C Thus, as the environmental temperature T increases, leakage current, $I_{OFF}$ of the NMOS N+K−1 also increases. Similarly, as the environmental temperature T increases, the threshold voltage, VTH0 of the NMOS M(N+K−1) also increases, thereby causing an increase in the leakage current, $I_{OFF}$ of the NMOS M(N+K−1). The leakage current $I_{OFF}$ of the NMOS M(N+K−1) causes excess charge to accumulate at the at the sensing output node 208, such that error in the sensing output voltage, VSOUT increases causing problems with the accuracy of the voltage detector 200.

Referring back to FIG. 1, to solve the problem with inaccuracy of the output voltage demonstrated by the voltage detector 200 of FIG. 2, the voltage detector 100 employs two resistive ladders, namely the first resistive ladder 102 and the second resistive ladder 104 and the ladder selector 112 to reduce a leakage current $I_{OFF}$ of the last transistor namely transistor, M(2, N+K−1). More particularly, in operation, the ladder selector signal, SELRLADDER selects a ladder, and a positive bias voltage (e.g., about 5 V) corresponding to a logical 1 is applied to a control node of a selected one of the K number of transistors to turn the selected transistor on (e.g., drive to saturation mode). The non-selected N+K−2 transistors receive a logical 0 (e.g., a signal of about 0 V), such that the non-selected N+K−2 transistors are turned-off (e.g., operate in cutoff mode). In this manner, current flows from the sensing input node 106, through each resistor arranged in the selected resistive ladder through the ladder selector 112 and to the electrically neutral node 114. This flow of current induces a detectable voltage at the sensing output node 108 defining the output sensing voltage, VSOUT that varies based on the sensing input voltage, VSIN and a ratio of resistance between resistors prior to the selected transistor and after the selected transistor in the resistive ladder that includes the selected transistor. Stated differently, the selected ladder operates as a voltage divider, and the output node of the selected transistor taps an intermediate node of the divider to measure a fractional portion of the sensing input voltage, VSIN that varies relative to which of the N+K−1 number of transistors is selected. The selected fractional portion of the sensing input voltage, VSIN corresponds to a selected detector threshold voltage, VTH. A reference voltage, VREF is selected such that the output sensing voltage, VSOUT is less than or equal to the reference voltage, VREF if the sensing input voltage, VSIN is less than or equal to the selected detector threshold, VTH.

The selected transistor is selected based on a selected detector threshold voltage, VTH. More particularly, the voltage detector 100 has a detector threshold voltage, VTH that ranges from a high detector threshold voltage, VTH_HIGH to a low threshold voltage, VTH_LOW. Each instance of the detector threshold, VTH corresponds to a particular selectable fractional proportion of the sensing input voltage, VSIN. As one example, the high threshold voltage, VTH_HIGH is about 50 V and the low threshold voltage, VTH_LOW is about 0.5 V. The selected detector threshold voltage, VTH is based on the sequence number of the selected transistor. For example, to select the high threshold voltage, VTH_HIGH, the last of the N+K−1 number of transistors, namely transistor M(2,N+K) is selected. Additionally, to select the low threshold voltage, VTH_LOW, the first of the N+K−1 number of transistors is selected, namely, transistor M(1,1). Other threshold voltages can be set by selecting a different transistor to tap a desired voltage along one of the respective ladders.

As a given example (hereinafter, the given example), it is presumed that the controller 110 is configured to select transistor M(1,1) such that the desired detector threshold voltage, VTH is the low threshold voltage, VTH_LOW. Additionally, it is presumed that the N+K−1 number of transistors are NMOSs. In the given example, the ladder selector signal, SELRLADDER selects the first resistive ladder 102, and the ladder selector 112 is configured to couple the second node of the resistor R(1,N+K) to the electrically neutral node 114. Additionally, the positive bias voltage (e.g., about 5 V) corresponding to a logical 1 is applied to the control node of transistor M(1,1) to turn on transistor M(1,1). The non-selected transistors, namely transistors M(1,2) to M(2,N+K) receive a logical 0 (e.g., a signal of about 0 V), such that the remaining transistors M(1,2) to M(2,N+K−1) are turned-off (e.g., operate in cutoff mode). In this manner, current flows from the sensing input node 106, through the resistors R(1,1) . . . R(1,N+K), through the ladder selector 112 and to the electrically neutral node 114. Additionally, the voltage at the input node of the selected transistor M(1,1) is a fractional portion of the input sensing voltage, VSIN. Moreover, the voltage at the sensing output node 108 of the selected transistor M(1,1), VSOUT is define by Equation 4:

$$VSOUT = VSIN \frac{R(1, 2) + \ldots + R(1, N + K)}{R(1, 1) + R(1, 2) + \ldots + R(1, N + K)} - VM(1, 1) \quad \text{Equation 4}$$

Wherein:
R(1,1) . . . R(1,N+K) is a resistance of reach respective resistor; and VM(1,1) is the voltage drop between the input node of and the output node of the selected transistor M(1,1) (e.g., a source to drain voltage).

This voltage at the sensing output node 108, defines the output sensing voltage, VSOUT. The output sensing voltage, VSOUT varies based on the input sensing voltage, VSIN and the resistance of the resistors R(1,1) . . . R(1,N+K). Moreover, the output sensing voltage, VSOUT is less than or equal to a reference voltage, VREF that corresponds to the low threshold voltage, VTH_LOW.

Continuing with the given example, the output node (e.g., a drain) of transistor M(2,N+K) (the last transistor in the sequence of transistors of the second resistive ladder 104) has a voltage that is less than or equal to the reference voltage, VREF that corresponds to the low threshold voltage, VTH_LOW. Moreover, because the second node of the resistor R(2,N+K) is electrically isolated from the electrically neutral node (by the ladder selector 112), the source of the transistor M(2,N+K) is kept to a magnitude of at least about twice the low threshold voltage, VTH_LOW of the voltage detector 100. Accordingly, the bias voltage at the control node of the transistor M(2,N+K−1) is controlled. More particularly, in situations where the N+K−1 number of transistors are implemented as NMOSs, the gate to source voltage of the transistor M(2,N+K−1), $V_{GS}$ is defined by Equation 5.

$$V_{GS} \leq -2 * VTH\_LOW \quad \text{Equation 5:}$$

Wherein:
$V_{GS}$ is the gate to source voltage of the transistor N+K−1; and
VTH_LOW is the low threshold voltage of the voltage detector.

As demonstrated by Equation 5, the gate to source voltage of the transistor M(2,N+K−1) is lower (greater negative magnitude) than the gate to source voltage of the transistor M(N+K−1) for the single resistive ladder 202 of FIG. 2. By ensuring that the gate to source voltage of the transistor N+K−1 complies with Equation 5, leakage current of the transistor N+K−1, $I_{OFF}$ conforms to Equation 6. The leakage current, $I_{OFF}$ is alternatively referred to as a sub-threshold current or off current.

$$I_{OFF} \propto e^{-\frac{1}{2}\frac{VTH\_LOW - VTH0}{VT}} \quad \text{Equation 6}$$

Wherein:
$I_{OFF}$ is the leakage current of transistor M(N+K−1);
e is Euler's number, approximately 2.71828;
VTH_LOW is the low threshold voltage of the voltage detector;
VTH0 is the threshold voltage of the transistor M(N+K−1); and
VT is the temperature voltage derived from Equation 3.

The leakage current, $I_{OFF}$ of the transistor M(2,N+K−1) is the greatest in situations where the selected detector threshold voltage, VTH is the low threshold voltage, VTH_LOW of the voltage detector 200, such as in the given example, wherein the output sensing voltage, VSOUT is greatest selectable fractional portion of the sensing input voltage, VSIN. Moreover, if a different detector threshold voltage, VTH is selected (other than the high threshold voltage, VTH_HIGH), the leakage current, $I_{OFF}$ the transistor M(2,N+K−1) is less than the leakage current for the transistor M(2,N+K−1) in the given example. In situations where the high threshold voltage, VTH_HIGH is selected, the transistor M(2,N+K−1) is turned on (e.g., operates in the saturation mode), such that there is no leakage current at the transistor M(2,N+K−1). In the situation high threshold voltage, VTH_HIGH is selected, the output sensing voltage, VSOUT is the smallest selectable fractional portion of the sensing input voltage, VSIN.

The actual leakage current, $I_{OFF}$ of the transistor M(2,N+K−1) varies as a function of gate and length width and a threshold voltage. More specifically, by de-coupling the second node of the respective resistor R (2,N+K) from the electrically neutral node, the gate to source voltage, $V_{GS}$ of transistor M(2,N+K−1) is elevated (in the negative direction), thereby reducing the leakage current, $I_{OFF}$. As compared to the voltage detector 200 of FIG. 2 with the single resistive ladder 202, the leakage current, $I_{OFF}$ of the voltage detector 100 of the transistor M(2,N+K−1) is no longer proportional to the ratio of the low threshold voltage VTH_LOW and the high threshold voltage, VTH_HIGH. Thus, a larger ratio between the low threshold voltage VTH_LOW and the high threshold voltage, VTH_HIGH is achievable with a nearly constant accuracy over the voltage range of the voltage detector 100. Accordingly, in situations where the ratio between low threshold voltage VTH_LOW and the high threshold voltage, VTH_HIGH is greater than one-half (½), the leakage current $I_{OFF}$ of the transistor M(2,N+K−1) is less sensitive to changes in the environmental temperature, T relative to the voltage detector 200. Additionally, leakage current, $I_{OFF}$ of the transistor M(2,N+K−1) contributes to the output sensing voltage, VSOUT. Thus, curtailment of the leakage current, $I_{OFF}$ increases an accuracy of the output sensing voltage, VSOUT, particularly over a temperature range.

By employing the voltage detector 100, the leakage current $I_{OFF}$ of transistor M(2,N+K−1) is curtailed, particularly in situations where the low threshold VTH_LOW is selected, and the leakage current, $I_{OFF}$ of transistor M(2,N+K−1) has the greatest magnitude. Curtailment of this leakage current, $I_{OFF}$ enables the voltage detector 100 to implement a wider range of voltages for the high threshold voltage, VTH_HIGH and the low threshold voltage, VTH_LOW for a large temperature range than the to the voltage detector 200 of FIG. 2 with the single resistive ladder 202, which loses accuracy at a temperature of about 60 degrees Celsius.

Figure 3:
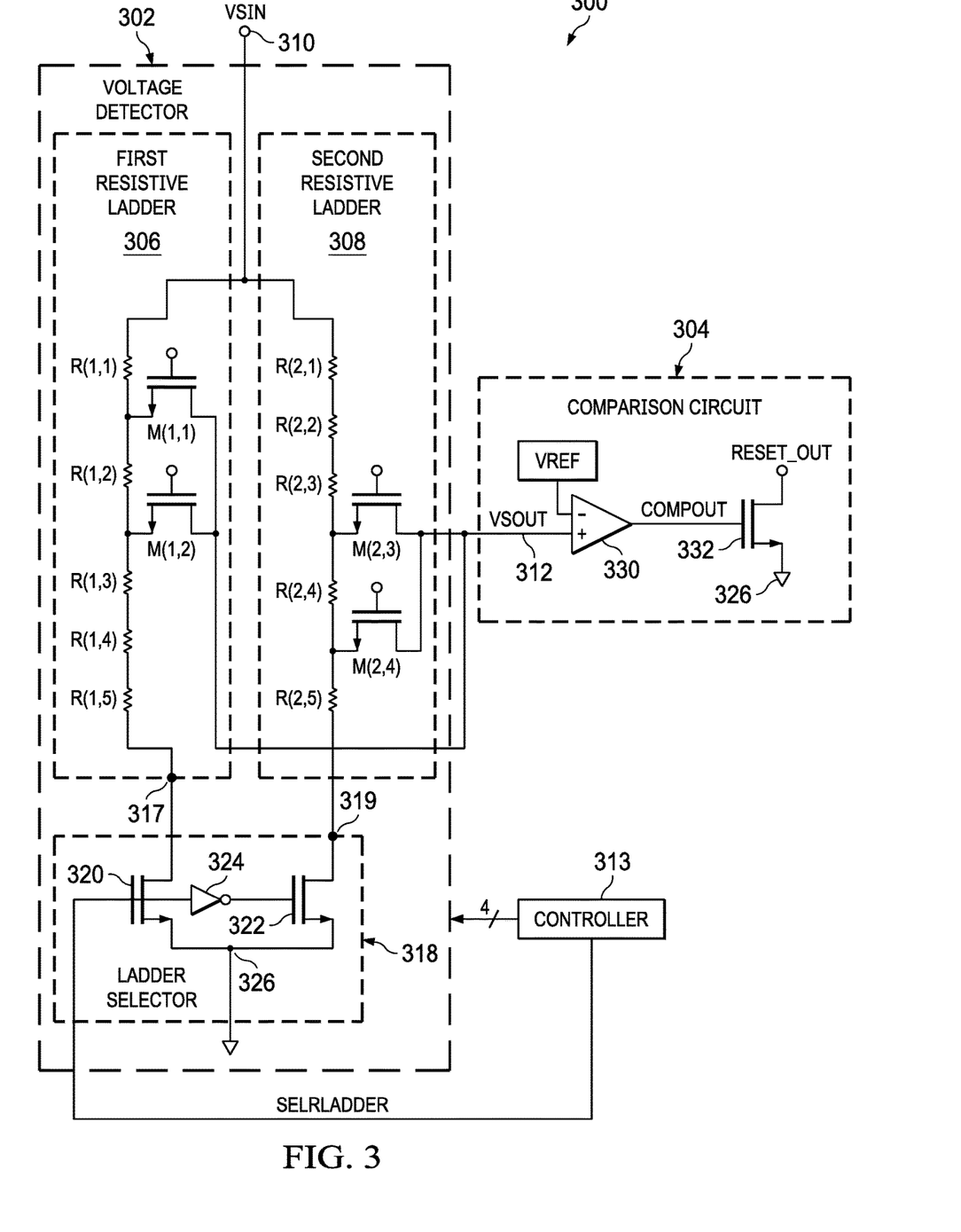
FIG. 3 illustrates a circuit diagram of a supply voltage supervisor for sensing a voltage level of a device.

FIG. 3 illustrates a circuit diagram of a supply voltage supervisor (SVS) 300 for sensing a voltage level of a device, such a voltage source. The supply voltage supervisor 300 includes a voltage detector 302 that curtails leakage current in a last NMOS of the voltage detector to increase accuracy of the voltage detector 302. In some examples, the voltage detector 302 is a specific implementation of the voltage detector 100 of FIG. 1. The supply voltage supervisor 300 also includes a comparison circuit 304.

The voltage detector 302 includes a first resistive ladder 306 with a respective string of resistors and a second resistive ladder 308 with a respective string of resistors. The first resistive ladder 306 and the second resistive ladder 308 are coupled between a sensing input node 310 and a sensing output node 312. The voltage detector 302 is configured such that a voltage at the sensing output node 312, VSOUT is a selectable fractional portion a sensing input voltage, VSIN at the sensing input node 310. Each selectable fractional portion of the sensing input voltage, VSIN corresponds to a particular instance of a detector threshold voltage, VTH. Moreover, a reference voltage, VREF is selected such that the voltage at the sensing output node 312, VSOUT is nearly equal to the reference voltage, VREF if the sensing input voltage VSIN at the sensing input node 310 is about equal to the detector threshold voltage, VTH. Stated differently, the reference voltage, VREF is selected to be equal to the detector threshold voltage, VTH. Moreover, the voltage detector 302 is designed such that the detector threshold voltage, VTH is selectable in a manner described herein.

In the example illustrated by the supply voltage supervisor 300, the first resistive ladder 306 and the second resistive ladder 308 includes five resistors. The resistors in the first resistive ladder 306 and the second resistive ladder 308 are labeled with a unique two-dimensional index number, such as R(i,j) that denotes the same references as the two-dimensional indices employed in FIG. 1. That is, the first number, i of the two-dimensional index identifies a ladder number and the second number, j of the two-dimensional index number identifies a resistor within a sequence of resistors in the respective ladder. Moreover, in some examples, resistors with the same sequence number have the same or nearly the same resistance (e.g., within about 10Ω). Thus, in such examples, resistors R(1,1) and R(2,1) have the same or nearly the same resistance.

The first resistive ladder 306 also includes two NMOSs labeled with the same index number as a respective resistor. More particularly, the first resistive ladder 306 includes NMOSs M(1,1) to M(1,2). Similarly, the second resistive ladder 308 has two NMOSs labeled with the same index number as a respective resistor. More particularly, the second resistive ladder 308 includes NMOSs M(2,3) to M(2,4). Thus, the first resistive ladder 306 and the second resistive ladder 308 have a combined total of four NMOSs. The four number of NMOSs are configured as trim switches in response to trim signals from a controller 313.

A drain of each of the NMOSs M(1,1) to M(2,4) is coupled to the sensing output node 312. Moreover, in some examples, a gate of the four NMOSs M(1,1) to M(2,4) is controlled by a controller 313, such as a trim controller. Alternatively, the controller 313 may be implemented by digital logic or programmed memory. In other examples, the control node of the four NMOSs M(1,1) to M(2,4) are hard-wired to particular nodes with particular voltage levels. The controller 313 is illustrated as having four outputs, that are each routed to a control node (e.g., a gate) of a respective transistor. For purposes of readability, FIG. 3 omits individual paths from the controller 313 to the control nodes of each of the NMOSs.

A first node of the first resistor of the first resistive ladder 306, namely resistor R(1,1) is coupled to the sensing input node 310. A second node of the resistor R(1,1) is coupled to an input node (e.g., a source) of the respective NMOS, namely, transistor M(1,1), forming a first rung of the first resistive ladder 306. Additionally, the second node of the resistor R(1,1) is coupled to a first node of the second resistor of the first resistive ladder 102, namely, resistor R(1,2). Accordingly, the input node of NMOS M(1,1) is coupled to an intermediate node between resistors R(1,1) and R(1,2). In a similar manner, a second node of the resistor R(1,2) is coupled to an input node (e.g., a source) of the respective NMOS namely NMOS M(1,2) forming a second rung of the first resistive ladder 306. Accordingly, the input node of NMOS M(1,2) is coupled to an intermediate node between resistors R(1,2) and R(1,3). In a similar manner, the third through fifth resistors, namely resistors R(1,3), R(1, 4) and R(1,5) are coupled in series between resistor R(1,2) and node 317. That is, a second node of the last resistor of the first resistive ladder 102, namely resistor R(1,5) is coupled to a first node 317 of a ladder selector 318.

A first node of the first resistor of the second resistive ladder 308, namely resistor R(2,1) is coupled to the sensing input node 310. Additionally, in the second resistive ladder, resistors R(2,1), R(2,2) and R(2,3) are connected in series between sensing input node 310 and a second node of the resistor R(2,3). The second node of the resistor R(2,3) is also coupled to a source of the respective transistor, namely, NMOS M(2,3), forming a first rung of the second resistive ladder 308. Additionally, the second node of the resistor R(2,3) is coupled to a first node of the next resistor of the second resistive ladder 308, namely, resistor R(2,4). Accordingly, the input node of transistor M(2,3) is coupled to an intermediate node between resistors R(2,3) and R(2,4). In a similar manner, a second node of the resistor R(2,4) is coupled to a source of the respective NMOS, namely NMOS M(2,4) forming a second rung of the second resistive ladder 308. Accordingly, the input node of transistor M(2,4) is coupled to an intermediate node between resistors R(2,4) and R(2,5). Additionally, a second node of the last resistor of the second resistive ladder 308, namely resistor R(2,5) is coupled to a second node 319 of the ladder selector 318.

As explained, the first resistive ladder 306 and the second resistive ladder 308 both have a string of resistors connected in series (without a respective intermediate NMOS). As noted, resistors R(1,3) to R(1,5) of the first resistive ladder 102 are connected in series and resistors R(2,1) to R(2,3) are connected in series. For purposes of simplification of explanation, these series of resistors R(1,4) to R(1,5) and R(2,1) to R(2,3) are illustrated as being discrete circuit components. However, in some examples, the series of resistors R(1,3) to R(1,5) and/or R(2,1) to R(2,3) are replaceable with a single resistor (or multiple resistors) that has an equivalent resistance.

The ladder selector 318 is configured to receive a ladder selector signal, SELRLADDER and to couple one of the first node 317 or the second node 319 of the ladder selector 318 to an electrically neutral node based on the ladder selector signal, SELRLADDER. The ladder selector 318 is illustrated as a specific implementation of the ladder selector 112 of FIG. 1. In some examples, the ladder selector signal, SELRLADDER is provided from the controller 313. In other examples, the ladder selector signal, SELRLADDER is hard-wired.

The ladder selector 318 is formed with a first NMOS 320 and a second NMOS 322. The ladder selector 318 also includes a NOT gate 324. A drain of the first NMOS 320 is coupled to the second node of the last resistor in the first resistive ladder, namely resistor R(1,5) at the first node 317 of the ladder selector 318. A source of the first NMOS 320 is coupled to an electrically neutral node 326 (e.g., ground). A drain of the second NMOS 322 is coupled to the second node of a last resistor of the second resistive ladder 308, namely resistor R(2,5) at the second node 319 of the ladder selector 318. Moreover, a source of the second NMOS 322 is also coupled to the electrically neutral node 326.

A gate of the first NMOS 320 is controlled by a ladder selection signal, SELRLADDER. Moreover, the selection ladder signal, SELRLADDER is also applied to an input node of the NOT gate 324. An output node of the NOT gate 324 is coupled to the gate of the second NMOS 322 to provide an inverted version of the selection ladder signal, SELRLADDER signal. In the example illustrated, the ladder selector 318 is configured such that if the ladder selection signal, SLRLADDER is a logical 1 (e.g., positive voltage), the first NMOS 320 turns on (e.g., driven to the saturation mode), thereby allowing current to pass from the second node of the resistor R(1,5) to the electrically neutral node 326, such that the second node of the resistor R(1,5) has a voltage level near 0 V. Concurrently, the selection ladder signal, SELRLADDER is fed through the NOT gate 324, and the output of the NOT gate 324 applies a logical 0 (e.g., 0 V) to the gate of the second NMOS 322, causing the second NMOS 322 to turn off (e.g., operates in the cutoff mode), de-coupling the second node 319 the last resistor in the second resistive ladder 308, resistor R(2,5), from the electrically neutral node 326.

Additionally, in the example illustrated, the ladder selector 318 is configured such that if the ladder selection signal is a logical 0 (e.g., near 0 V), the first NMOS 320 turns off (e.g., operates in the cutoff mode), thereby de-coupling the second node 319 of the resistor R(1,5) from the electrically neutral node 326. Additionally, the selection ladder signal, SELRLADDER is fed through the NOT gate 324, and the output of the NOT gate 324 applies a logical 1 (e.g., positive voltage signal) to the gate of the second NMOS 322, causing the second NMOS 322 to turn on (e.g., driven to the saturation mode), thereby coupling the second node 319 of the ladder selector 318 with the electrically neutral node 326 allowing current to pass from the second node of the resistor R(2,5) to the electrically neutral node 326, such that the second node of the resistor R(2,5) (the second node 319) has a voltage level near 0 V.

As a further example, the comparison circuit 304 includes a comparator 330. The sensing output node 312 is coupled to a non-inverting input of the comparator 330. Accordingly, the sensing output voltage, VSOUT is applied to the non-inverting input of the comparator 330. The reference voltage, VREF is applied to an inverting input of the comparator 330. An output of the comparator 330 is coupled to a gate of an NMOS 332 of the comparison circuit 304. A source of the NMOS 332 is coupled to the electrically neutral node 326 (e.g., ground) and a drain of the NMOS 332 provides a reset output signal, RESET_OUT to an external component, such as a system controller.

By way of example, the controller 313 is configured to provide the selection ladder signal, SELRLADDER to select a ladder, and to provide a positive bias voltage (e.g., about 5 V) corresponding to a logical 1 is applied to a gate of a selected NMOS M(1,1)-M(2,4), to turn the selected NMOS on (e.g., drive to saturation mode). The non-selected NMOSs receive a logical 0 (e.g., a signal of about 0 V) at the respective gates, such that the non-selected NMOSs are turned-off (e.g., operate in cutoff mode). In this manner, current flows from the sensing input node 310, through each resistor arranged in the selected ladder and to the electrically neutral node 326. This flow of current induces a voltage drop across the selected ladder. Moreover, a portion of this voltage drop is detectable at an in node of the selected NMOS and passed through the selected NMOS to produce a voltage at the sensing output node 312 to define the output sensing voltage, VSOUT. In this manner, output sensing voltage varies based on the sensing input voltage, VSIN and a proportional resistance of each of the resistors prior to the selected NMOS relative to the resistance of resistors after the selected NMOS. In the example illustrated, in a normal mode operation, the output sensing voltage, VSOUT is less than or equal to a reference voltage, VREF corresponding to the selected detector threshold, VTH. If the output sensing voltage, VSOUT raises to a level above the reference voltage, VREF, the reset output signal, RESET_OUT is triggered in manner described herein.

The selected NMOS is selected based on a desired detector threshold voltage, VTH. More particularly, the voltage detector 302 has a detector threshold voltage, VTH that ranges from a high threshold voltage, VTH_HIGH to a low threshold voltage, VTH_LOW. As one example, the high threshold voltage, VTH_HIGH is about 50 V and the low threshold voltage, VTH_LOW is about 0.5 V. The selected detector threshold voltage is based on the sequence number of the selected NMOS. For instance, to select the high detector threshold voltage, VTH_HIGH, the last NMOS, namely NMOS M(2,4) is selected, which causes the output sensing voltage, VSOUT to be a smallest selectable fractional portion of the input sensing voltage, VSIN. Additionally, to select the low threshold voltage, VTH_LOW, the first of the NMOSs is selected, namely, NMOS M(1,1), which causes output sensing voltage, VSOUT to be a greatest selectable fractional portion of the input sensing voltage, VSIN.

As a specific implementation of the given example described with respect to FIG. 1, in the given example, it is presumed that the NMOS M(1,1) is selected such that the desired threshold voltage is the low threshold voltage, VTH_LOW, such that VSOUT is the greatest selectable fractional portion of the input sensing voltage, VSIN. In the given example, the ladder selector signal, the controller 313 provides SELRLADDER to select the first resistive ladder 306, which couples the second node of the resistor R(1,5) and node 317 to a level near the electrically neutral node 326 (e.g., near 0 V). Additionally, the controller provides a positive bias voltage (e.g., about 5 V) corresponding to a logical 1 is applied to the gate of NMOS M(1,1) to turn on NMOS M(1,1). The non-selected transistors, namely transistors M(2,2) to M(2,4) receive a logical 0 (e.g., a signal of about 0 V) at the respective gates, such that the remaining NMOSs M(2,2) to M(2,4) are turned-off (e.g., operate in cutoff mode). In this manner, current flows from the sensing input node 310, through the resistors R(1,1) to R(1,5), through the first NMOS 320 and to the electrically neutral node 326. In the given example, the NMOS M(1,1) taps the voltage an intermediate node between resistors R(1,1) and R(1,2) to provide a corresponding voltage at the sensing output node 312. This voltage tapped by the NMOS M(1,1) is fractional portion of the input sensing voltage, VSIN. This fractional portion of the input sensing voltage, VSIN is provide at the sensing output node 312, defining the output sensing voltage, VSOUT. The output sensing voltage, VSOUT varies based on the input sensing voltage, VSIN and the proportion of resistance of resistor R(1,1) relative to the resistance of the remaining resistors R(1,2) . . . R(1,5) in the first resistive ladder 306.

Continuing with the given example, the drain of NMOS M(2,4) (the last NMOS in the sequence of transistors) has a voltage that is equal to VSOUT less than or equal to the reference voltage, VREF that corresponds to the low threshold voltage, VTH_LOW when the input voltage is operating in the normal mode of operation. Moreover, since the second node of the resistor R(2,5) is decoupled from the electrically neutral node (by the ladder selector 318), the source of the NMOS M(2,4) is kept to a level of at least about twice the low threshold voltage, VTH_LOW of the voltage detector 302. Accordingly, bias voltage at the gate of the NMOS M(2,4) is controlled. More particularly, the gate to source voltage, $V_{GS}$ of the NMOS M(2,4) is defined by Equation 5. Additionally, by ensuring that the gate to source voltage, $V_{GS}$ of the NMOS M(2,4) complies with Equation 5, leakage current $I_{OFF}$ of the NMOS M(2,4) conforms to Equation 6.

The leakage current, $I_{OFF}$ of the NMOS M(2,4) is the greatest in situations where the selected detector threshold voltage, VTH is the low threshold voltage, VTH_LOW of the voltage detector 302, such as in the given example.

Moreover, if a different detector threshold voltage, VTH is selected (other than the high threshold voltage, VTH_HIGH), the leakage current, $I_{OFF}$ the NMOS M(2,4) is less than the leakage current for the NMOS M(2,4) in the given example. In situations where the high threshold voltage, VTH_HIGH is selected, the NMOS M(2,4) is turned on (e.g., operates in the saturation mode), such that there is no leakage current at the NMOS M(2,4).

By way of example, the actual leakage current, $I_{OFF}$ of NMOS M(2,4) varies as a function of gate and length width and a threshold voltage of the NMOS M(2,4). As compared to the voltage detector 200 with the single resistive ladder 202, the leakage current, $I_{OFF}$ of the NMOS M(2,4) is reduced. More specifically, be de-coupling the second node of the respective resistor R(2,5) from the electrically neutral node, the gate to source voltage, $V_{GS}$ is reduced (increased negative magnitude), thereby reducing the leakage current, $I_{OFF}$. Moreover, the leakage current $I_{OFF}$ is less sensitive to changes in temperature of a surrounding environment. Additionally, leakage current, $I_{OFF}$ contributes to the output sensing voltage, VSOUT. Thus, curtailment of the leakage current, $I_{OFF}$ as in the supply voltage supervisor 300 increases an accuracy of the output sensing voltage, VSOUT.

As noted, in the normal mode of operation, the sensing output voltage signal, VSOUT is less than or equal to the reference voltage, VREF. Accordingly, in the normal mode of operation, the output of the comparator 330, COMPOUT is a logical 0 (e.g., low voltage) signal, such that the NMOS 332 is turned off (operates in the cutoff mode). If the NMOS 332 is turned off, the reset output signal, RESET_OUT is high impedance node. High impedance node is interpreted by the external component as the voltage source (that provides the voltage sensing input signal, VSIN) as operating properly (in the normal mode of operation).

Conversely, in a fault mode of operation, the sensing output voltage signal, VSOUT is greater than the reference voltage, VREF such that the output of the comparator 330, COMPOUT is a logical 1 (e.g., a high voltage). In this situation, the COMPOUT (a logical 1) turns on the NMOS 332 (operates in the saturation mode), which in turn causes the reset output signal, RESET_OUT to pulled to ground through NMOS 332 and provide a logical 0 (e.g., a low voltage). The logical 0 is interpreted by the controller 313 as the voltage source (that provides the voltage sensing input signal, VSIN) as exceeding an acceptable level and needs to be reset because sensing output voltage signal, VSOUT is greater than the reference voltage, VREF.

By employing the voltage detector 302 the leakage current $I_{OFF}$ of transistor M(2,4) is curtailed, particularly in situations where the low threshold is selected and the leakage current $I_{OFF}$ of the NMOS M(2,4) is at the greatest magnitude. Curtailment of this leakage current, $I_{OFF}$ enables a wider range of voltages for the high threshold voltage, VTH_HIGH and the low threshold voltage, VTH_LOW. Additionally, curtailment of the leakage current, $I_{OFF}$ of the of NMOS M(2,4) increases an accuracy of the output sensing voltage, VSOUT, particularly in situations with elevated temperatures.

Figure 4:
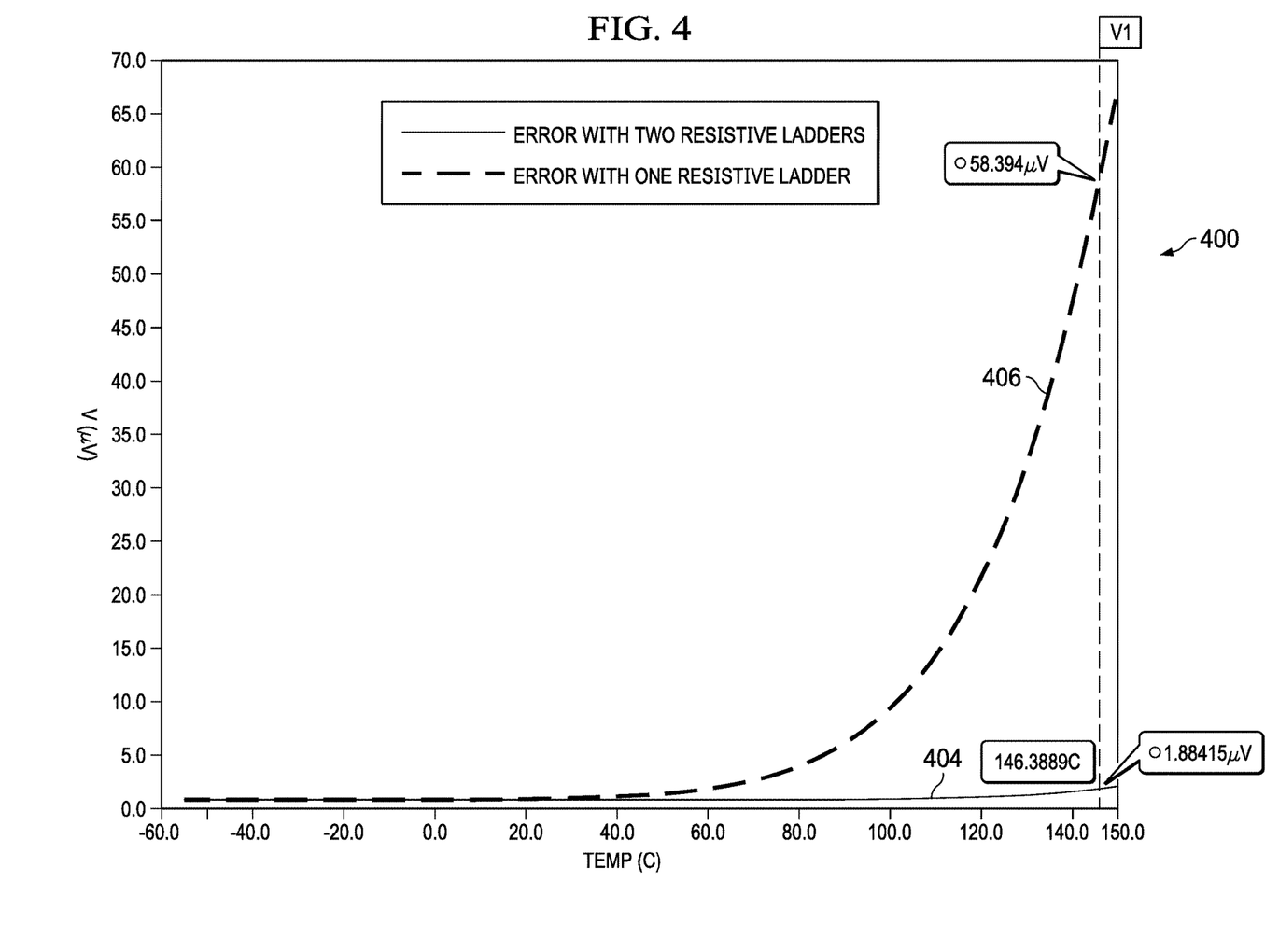
FIG. 4 illustrates an example of a chart that plots an error of a sensed voltage as a function of temperature.

FIG. 4 illustrates an example of a chart 400 that plots an error of a sensed voltage (in microvolts) as a function of temperature (in degrees Celsius (° C.)) for two different voltage detectors. More particularly, the chart 400 includes a first plot 404 that is representative of a voltage detector with two ladders, such as the voltage detector 100 of FIG. 1 and/or the voltage detector 302 of FIG. 3. Additionally, the chart 400 includes a second plot 406 that is representative of a voltage detector with a single ladder (e.g., the voltage detector 200 of FIG. 2). As is illustrated by the plot 406, as the temperature increases, the error in the sensed voltage the voltage detector with a single ladder increases exponentially. In contrast, in the sensed voltage by the voltage detector with two ladders characterized in the first plot 404, the error stays relatively constant over a wide range of temperatures.

Figure 5:
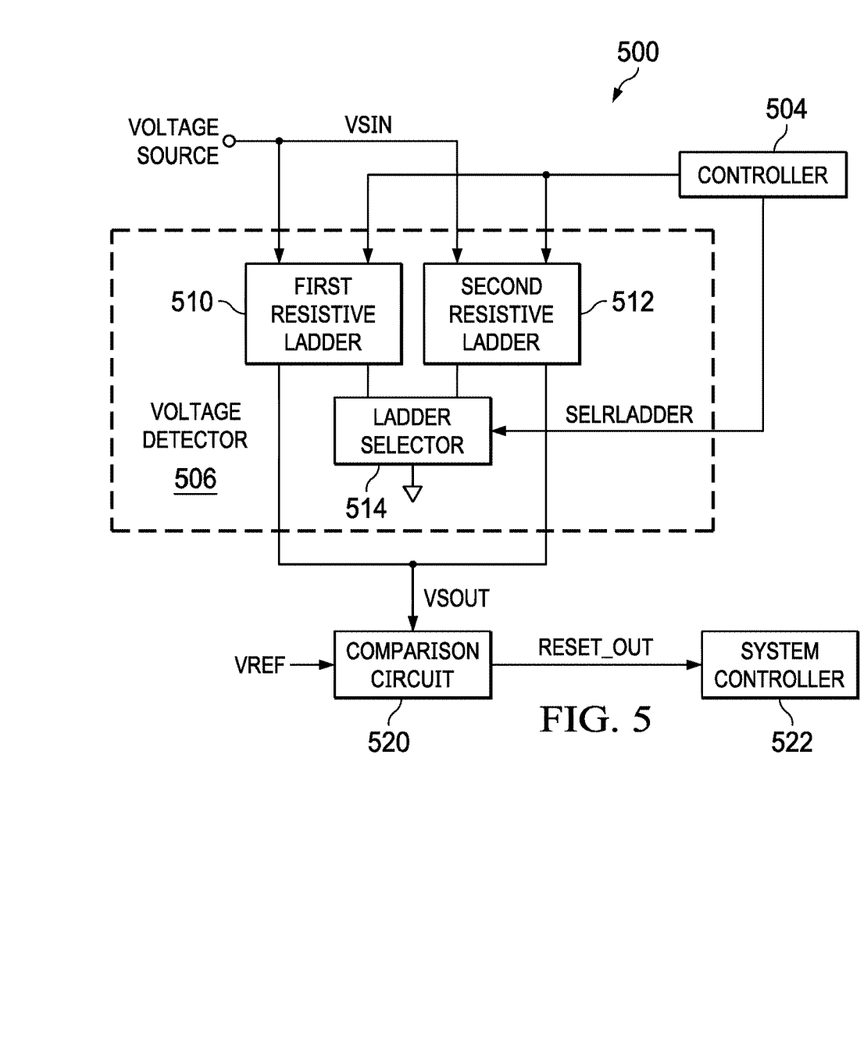
FIG. 5 illustrates a system that monitors an output voltage of a voltage source.

FIG. 5 illustrates an example of a system 500 configured to monitor an output voltage of a voltage source. In some examples, the system 500 includes a ladder controller 504 (e.g., a digital controller, such as the controller 110 of FIG. 1 and/or the controller 313 of FIG. 3) configured to control a state of transistors (e.g., trim switches) on a voltage detector 506. The voltage detector 506 can be implemented by a two-ladder voltage detector, such as the voltage detector 100 of FIG. 1 and/or the voltage detector 302 of FIG. 3.

The voltage detector 506 includes a first resistive ladder 510 and a second resistive ladder 512. The first resistive ladder 510 may be implemented as the first resistive ladder 102 of FIG. 1 and/or the first resistive ladder 306. Similarly, the second resistive ladder 512 may be implemented as the second resistive ladder 104 of FIG. 1 and/or the second resistive ladder 308 of FIG. 3. The voltage detector 506 also includes a ladder selector 514, such as the ladder selector 112 of FIG. 1 and/or the ladder selector 318 of FIG. 3. The sensing input signal, VSIN is supplied to an input sensing node that is shared by the first resistive ladder 510 and the second resistive ladder 512. Additionally, the ladder controller 504 is configured to apply control signals to the first resistive ladder 510, the second resistive ladder 512 and the ladder selector 514.

The first resistive ladder 510 and the second resistive ladder 512 are configured to generate a sensing output voltage signal, VSOUT that is provided to a comparison circuit 520. In operation, the ladder controller 504 is configured to set a threshold voltage for the sensing output signal, VSOUT. For example, to set the threshold voltage, the ladder controller 504 provides a selection ladder signal, SELRLADDER signal to the ladder selector 514 and provides a control signal to turn on a selected transistor in the first resistive ladder 510 or the second resistive ladder 512. Additionally, the ladder controller 504 provides control signals to turn off each non-selected transistor in the first resistive ladder 510 and the second resistive ladder 512. In this manner, a voltage across one or more resistors positioned downstream from the selected transistor is tapped to provide a corresponding voltage drop that is provided through the selected transistor to produce e to produce the sensing output voltage, VSOUT.

The comparison circuit 520 compares the sensing output voltage signal, VSOUT to a reference voltage, VREF. In situations where the sensing output voltage, VSOUT signal is greater than the reference voltage, VREF, the comparison circuit 520 de-asserts a reset output signal, RESET_OUT that is provided to a system controller 522. In some examples, the system controller 522 resets the voltage source in response to de-assertion of the rest output signal, REEST_OUT. In other examples, the reset output signal, RESET_OUT itself is employable to reset the system controller 522.

The system 500 is employable to monitor the output voltage of a voltage source where the voltage is in a range of 0.5 V to 100 V. For example, the system 500 is employable to monitor a 5 V voltage source for a digital logic controller. Alternatively, the system 500 is employable to monitor a 45 V voltage source employed to power an industrial motor. Further, the system 500 is employable to monitor a 60 V voltage source in a cold-cranking 12 V system (e.g., an automotive system). Still further, the system 500 is employable to monitor a 100 V voltage source employed in a battery pack.

Modifications are possible in the described embodiments, and other embodiments are possible, within the scope of the claims.

What is claimed is:

1. A voltage detector circuit comprising:
    a ladder selector comprising a first node, a second node and a selector node;
    a first resistive ladder comprising:
        a first string of resistors coupled between a sensing input node and the first node of the ladder selector; and
        a first set of transistors, wherein an input node of each transistor in the first set of transistors is coupled to a respective intermediate node between two resistors in a subset of resistors in the first string of resistors and an output node of each transistor in the first set of transistors is coupled to a sensing output node; and
    a second resistive ladder comprising:
        a second string of resistors coupled between the sensing input node and the second node of the ladder selector; and
        a second set of transistors, wherein an input node of each transistor in the second set of transistors is coupled to an intermediate node coupled between two resistors in a subset of resistors in the second string of resistors and an output node of each transistor in the second set of transistors is coupled to the sensing output node.

2. The voltage detector circuit of claim 1, wherein the ladder selector further comprises:
    a first selection transistor, wherein an input node of the first selection transistor is coupled to the first node of the ladder selector and an output node of the first selection transistor is coupled to an electrically neutral node; and
    a second selection transistor, wherein an input node of the second selection transistor is coupled to the second node of the ladder selector and an output node of the second selection transistor is coupled to the electrically neutral node.

3. The voltage detector circuit of claim 2, further comprising a controller configured to drive a control node of the first selection transistor and the second selection transistor.

4. The voltage detector circuit of claim 1, further comprising a controller configured to provide a set of outputs, wherein each output in the set of outputs is coupled to a respective control node in the first set of transistors or a respective control node in the second set of transistors.

5. The voltage detector circuit of claim 4, wherein a series resistance of the resistors of the first string of resistors of the first resistive ladder is nearly equal to a series resistance of the resistors of the second string of resistors of the second resistive ladder.

6. The voltage detector circuit of claim 4, wherein each transistor in the first set of transistors and the second set of transistors is an n-channel metal oxide semiconductor transistors (NMOSs).

7. The voltage detector circuit of claim 6, wherein the controller is configured to turn on one selected transistor in the first set of transistors or the second set of transistors and turn off non-selected transistors in the first set of transistors and the second set of transistors to set a detector threshold voltage within a range of a high threshold voltage and a low threshold voltage.

8. The voltage detector circuit of claim 7, wherein a last transistor in the second set of transistors has a leakage current that is proportional to Euler's number raised to the power of negative one-half of a difference between the low threshold voltage and the detector threshold voltage divided by a temperature voltage.

9. The voltage detector circuit of claim 1, further comprising a comparator, wherein the sensing output node is coupled to a first input of the comparator and a reference voltage is coupled to a second input of the comparator, wherein the comparator is configured to output a comparator signal representative of a voltage of the sensing output node relative to the reference voltage.

10. A voltage detector comprising:
a ladder selector configured to select between a first resistive ladder and a second resistive ladder;
the first resistive ladder comprising:
a first string of resistors coupled between a sensing input node and a first node of the ladder selector; and
a first set of transistors configured to tap intermediate nodes of a set of resistors in the first string of resistors;
the second resistive ladder comprising:
a second string of resistors coupled between the sensing input node and a second node of the ladder selector; and
a second set of transistors configured to tap intermediate nodes of a set of resistors in the second string of resistors;
wherein a selected transistor in one of the first set of transistors or the second set of transistors is turned on, and non-selected transistors of the first set of transistors and the second set of transistors are turned off to set a threshold voltage for a sensing output node.

11. The voltage detector of claim 10, further comprising a controller configured to control a state of the ladder selector and the controller is configured to turn on the selected transistor and to turn off the non-selected transistors of the first set of transistors and the second set of transistors.

12. The voltage detector of claim 11, wherein an input node of each transistor in the first set of transistors is coupled to a respective node between each pair of resistors of a subset of resistors in the first string of resistors of the first resistive ladder; and
wherein an input node of each transistor in the second set of transistors is coupled to a respective node between each pair of resistors of a subset of resistors in the second string of resistors of the second resistive ladder.

13. The voltage detector of claim 11, wherein the ladder selector is configured to:
receive a selection signal from the controller; and
couple one of the first or second nodes of the ladder selector with an electrically neutral node based on the selection signal according to which of the first and second ladder contains the selected transistor.

14. The voltage detector of claim 11, further comprising:
a comparator configured to compare a voltage at the sensing output node with a reference voltage, wherein the comparator is configured to provide a comparator output signal based on the voltage at the sensing output node relative to the reference voltage.

15. The voltage detector of claim 11, wherein the controller is configured to select a detector threshold voltage within a range of a high threshold voltage and a low threshold voltage.

16. The voltage detector of claim 15, wherein the high threshold voltage is about 40 volts to about 50 volts and the low threshold voltage is about 0.5 volts to about 1 volt.

17. A system comprising:
a controller configured to select a threshold voltage that is within a range of a low threshold voltage and a high threshold voltage;
a voltage detector comprising:
a ladder selector configured to select between a first resistive ladder and a second resistive ladder;
the first resistive ladder comprising:
a first string of resistors coupled between a sensing input node and a first node of a ladder selector; and
a first set of transistors configured to tap intermediate nodes of a set of resistors in the first string of resistors; and
the second resistive ladder comprising:
a second string of resistors coupled between the sensing input node and a second node of the ladder selector; and
a second set of transistors configured to tap intermediate nodes of a set of resistors in the first string of resistors; and
wherein the controller turns on a selected transistor of the first set of transistors or the second set of transistors and the controller turns off non-selected transistors of the first set of transistors and the second set of transistors to set the threshold voltage for a sensing output node; and
a comparator circuit configured to assert a reset signal based on a comparison of the voltage at the sensing output node and a reference voltage.

18. The system of claim 17, wherein the transistors of the first set of transistors and the second set of transistors are n-channel metal oxide semiconductor transistors (NMOSs).

19. The system of claim 18, wherein one NMOS of the NMOSs has a gate to source voltage that is less than or equal to negative two times the low threshold voltage.

20. The system of claim 17, wherein:
an input node of each transistor in the first set of transistors is coupled to an intermediate node between two resistors in a subset of the first string of resistors and an input node of each transistor in the second set of transistors coupled to an intermediate node between two resistors in a subset of the second string of resistors;
a series resistance of the subset of the first string of resistors of the first resistive ladder is approximately equal to a resistance between the sensing input node and a node in the second string of resistors that is connected to a next resistor in the second string of resistors and is not connected to an input node of a transistor in the second set of transistors; and
a series resistance of the subset of the second string of resistors of the second resistive ladder is approximately equal to a resistance between the an input node of a last transistor in the first set of transistors and the first node of the ladder selector.

21. A system comprising:
a battery; and
a voltage detector coupled to the battery and including:
a ladder selector comprising a first node, a second node and a selector node;

a first resistive ladder comprising:
- a first string of resistors coupled between a sensing input node and the first node of the ladder selector; and
- a first set of transistors, wherein an input node of each transistor in the first set of transistors is coupled to a respective intermediate node between two resistors in a subset of resistors in the first string of resistors and an output node of each transistor in the first set of transistors is coupled to a sensing output node; and a second resistive ladder comprising:
- a second string of resistors coupled between the sensing input node and the second node of the ladder selector; and
- a second set of transistors, wherein an input node of each transistor in the second set of transistors is coupled to an intermediate node coupled between two resistors in a subset of resistors in the second string of resistors and an output node of each transistor in the second set of transistors is coupled to the sensing output node.

22. The system of claim 21, wherein the system is an automotive system.

23. The system of claim 21, wherein the system is an industrial motor.

* * * * *